United States Patent
Lewis et al.

(10) Patent No.: US 7,315,560 B2
(45) Date of Patent: Jan. 1, 2008

(54) APPARATUS, SYSTEM, AND METHOD FOR JUNCTION ISOLATION OF ARRAYS OF SURFACE EMITTING LASERS

(75) Inventors: Alan Lewis, Sunnyvale, CA (US); Brad Cantos, San Francisco, CA (US); Glen P. Carey, Palo Alto, CA (US); William R. Hitchens, Mountain View, CA (US); Jason P. Watson, San Jose, CA (US); Aram Mooradian, Kentfield, CA (US)

(73) Assignee: Novalux, Inc., Sunnyvale, CA (US)

( * ) Notice: Subject to any disclaimer, the term of this patent is extended or adjusted under 35 U.S.C. 154(b) by 153 days.

(21) Appl. No.: 11/194,077

(22) Filed: Jul. 29, 2005

(65) Prior Publication Data

US 2006/0109883 A1 May 25, 2006

Related U.S. Application Data

(60) Provisional application No. 60/689,582, filed on Jun. 10, 2005, provisional application No. 60/667,201, filed on Mar. 30, 2005, provisional application No. 60/667,202, filed on Mar. 30, 2005, provisional application No. 60/666,826, filed on Mar. 30, 2005, provisional application No. 60/646,072, filed on Jan. 21, 2005, provisional application No. 60/592,890, filed on Jul. 30, 2004.

(51) Int. Cl.
*H01S 5/00* (2006.01)

(52) U.S. Cl. ............... 372/50.124; 372/50.12; 372/50.122

(58) Field of Classification Search ............. 372/50.12, 372/50.121, 50.122, 50.123, 50.124, 50.21, 372/50.22, 50.23
See application file for complete search history.

(56) References Cited

U.S. PATENT DOCUMENTS

| | | | |
|---|---|---|---|
| 5,386,139 A * | 1/1995 | Idei et al. ............... 257/466 |
| 5,489,984 A | 2/1996 | Hariharan et al. | |
| 5,585,913 A | 12/1996 | Hariharan et al. | |
| 5,748,317 A | 5/1998 | Maris et al. | |
| 5,887,012 A * | 3/1999 | Yamada ............... 372/50.12 |
| 6,271,921 B1 | 8/2001 | Maris et al. | |
| 6,400,449 B2 | 6/2002 | Maris et al. | |
| 2005/0078720 A1* | 4/2005 | Walker et al. ............ 372/36 |

* cited by examiner

*Primary Examiner*—Minsun Oh Harvey
*Assistant Examiner*—Tod T. Van Roy
(74) *Attorney, Agent, or Firm*—Cooley Godward Kronish LLP (57) ABSTRACT

An array of surface emitting laser diodes has a series electrical connection of laser diodes. Junction isolation is used to isolate laser diodes in the array.

25 Claims, 8 Drawing Sheets

APPARATUS, SYSTEM, AND METHOD FOR JUNCTION ISOLATION OF ARRAYS OF SURFACE EMITTING LASERS

CROSS-REFERENCE TO RELATED APPLICATIONS

This application claims the benefit of provisional application 60/592,890, filed on Jul. 30, 2004, the contents of which are hereby incorporated by reference. This application further claims the benefit of provisional applications: 60/667,201; 60/667,202; and 60/666,826, each of which was filed on Mar. 30, 2005; 60/646,072 filed on Jan. 21, 2005, and 60/689,582 filed on Jun. 10, 2005, the contents of each of which are hereby incorporated by reference.

BRIEF DESCRIPTION OF THE INVENTION

The present invention is generally related to systems in which an array of laser diodes formed on a common substrate are electrically connected in a series configuration. More particularly, the present invention is directed towards arrays of surface-emitting semiconductor lasers formed on a common substrate that are electrically connected in a series configuration.

BACKGROUND OF THE INVENTION

Figure 1A:
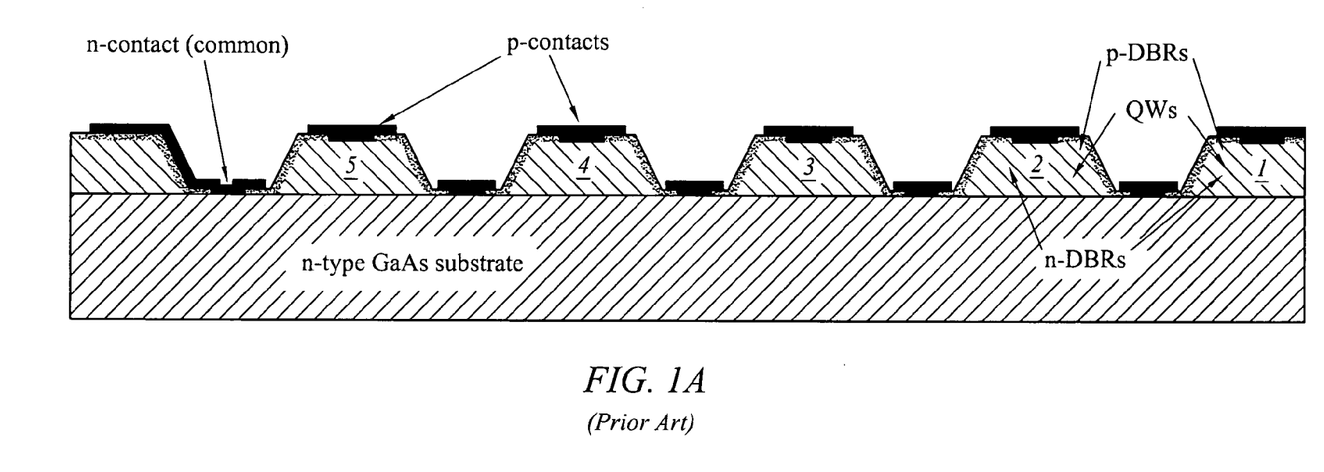
FIG. 1A illustrates a prior art parallel array of surface emitting lasers.

FIG. 1 shows an array of surface emitting laser diodes, in this case emitting light through the substrate, built using a conventional surface emitting laser architecture. These devices may be standard vertical cavity surface emitting lasers, or devices like those described in U.S. Pat. Nos. 6,243,407, 6,404,797, 6,614,827, 6,778,582, and 6,898,225, the contents of each of which are hereby incorporated by reference.

Figure 1B:
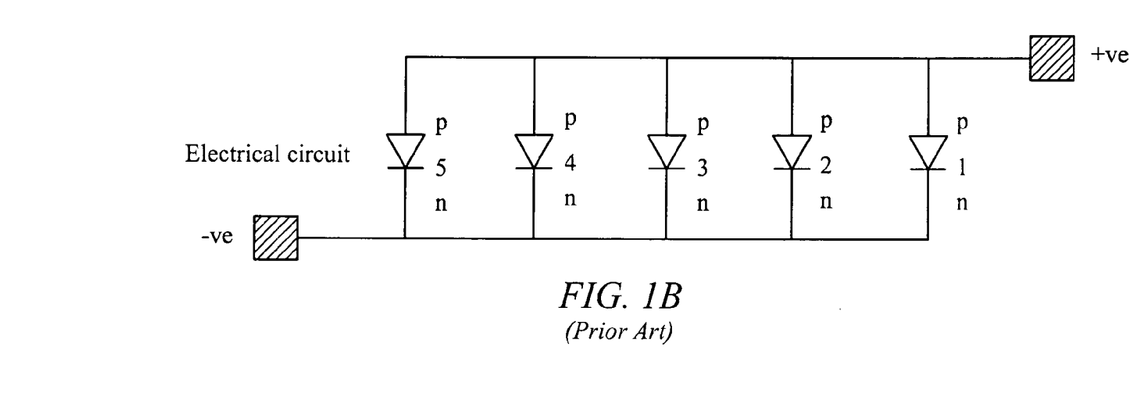
FIG. 1B illustrates an equivalent electrical circuit for the array of FIG. 1A.

Arrays of surface emitting laser diodes are typically formed on a common n-type substrate and thus have a common n-contact. FIG. 1B illustrates an array of surface emitting laser diodes formed on an n-type substrate. Each laser diode is commonly patterned as a mesa and may have a total height of several microns or more depending upon the total thickness of distributed Bragg reflectors (DBRs) and quantum well gain regions. Each laser diode may, for example, have an individual contact to a p-type semiconductor region. A separate common contact to the n-type substrate is formed. The equivalent circuit of the laser diodes is shown in FIG. 1B. However, there are several drawbacks to the parallel electrical connection.

One drawback is that small variations in diode characteristics can cause large variations in diode current, resulting in non-uniform light output and reduced efficiency. In a parallel configuration, all the diodes have basically the same forward voltage applied to their junctions. However, in practice the laser diodes will have slight variations in diode characteristics, thermal properties, and resistance. The amount of current that an ideal laser diode draws for a particular voltage increases exponentially with temperature. If one diode is slightly hotter than its neighbors, it will pass more current. Passing more current will cause the diode to heat up more, and it will pass even more current. This thermal run away means that most of the current delivered to the array will pass through just a small number of hot diodes. Even if thermal runaway does not occur, the example illustrates the impact of small non-uniformities on the current distribution over the array, and the problems associated with attempting to ensure uniform drive current across the array.

One potential solution to this problem is to add a resistor in series with every diode to regulate the current. This complicates the array interconnect scheme, and the power dissipated in the array of series resistors significantly lowers the overall system efficiency.

Another drawback with a parallel connection of laser diodes in an array is that the required current scales with the number of laser diodes in the array. As a result, a low-voltage, high current power supply is required to drive the array of laser diodes. As an illustrative example, a parallel connection scheme requires a high-current (as much as 1 A per emitter for large aperture devices) at low voltage (typically 2V). However, low voltage, high current power supplies tend to be costly and inefficient compared with higher voltage, lower current power supplies.

Moreover, another drawback of a parallel connection of laser diodes is that the high drive current places significant demands on the electrical interconnect structures used to deliver the current to the chip. In particular, a parallel connection of laser diodes requires designing portions of the interconnects to be compatible with high drive currents.

The problems with a parallel-connected array of laser diodes outlined above can be eliminated if the individual diodes in the array are electrically connected in series. In a series connection all of the laser diodes are forced to pass the same current, regardless of local temperature variations and/or differences between diodes in the array. The current requirements are reduced compared with a parallel electrical connection, allowing a smaller and more efficient power supply to be used. Additionally, the current delivered to the array is low enough to be easily handled by conventional die interconnect techniques such as flip-chip and wire bonds.

The difficulty with a series-connected array is that the individual diodes must be electrically isolated. This can be easily achieved if each diode is formed on its own die, but the use of multiple dies makes assembly difficult and expensive. It is much more desirable to form electrically isolated diodes on a common substrate. However, the device structure for surface emitting lasers is relatively deep (typically approximately 8 μm or more). Additionally, the vertical structure consists of distributed Bragg reflectors and a gain region that are formed from multiple layers of differing composition as well as different doping. An efficient surface emitting laser diode requires a low resistance connection such that many of the layers connected to the laser diode require a high doping-thickness product. There are thus a number of constraints on a fabrication process for efficient arrays of surface emitting lasers formed on a common substrate. Consequently, isolation techniques used in the semiconductor industry to isolate planar semiconductor devices cannot be directly applied to forming a series-connected array Therefore what is desired is an improved apparatus, system, and method for operating surface emitting lasers in series on a common substrate.

SUMMARY OF THE INVENTION

An array of surface emitting laser diodes formed on a common die has a series electrical connection of laser diodes. Junction isolation is used to isolate the laser diodes in the array from parasitic conduction in the die.

One embodiment of an apparatus comprises: an array of surface-emitting semiconductor laser diodes formed on a common die and electrically connected in series; and at least one p-n junction in the die disposed under the array, the at least one p-n junction configured to electrically isolate each of the surface-emitting semiconductor laser diodes from parasitic conduction in the die during operation of the array.

One embodiment of a system comprises: an array of surface-emitting semiconductor laser diode mesas formed on an electrical contact layer of a common die, the array of surface-emitting semiconductor laser diode mesas electrically connected in series between top contacts of each mesa and bottom contacts to the electrical connection layer; trenches formed in the electrical contact layer in regions between the laser diode mesas for blocking parasitic electrical conduction through the contact layer; and a substrate layer in the die disposed under the electrical contact layer and having a polarity opposite to that of the electrical contact layer for providing p-n diode junction isolation of parasitic conduction paths in the die during operation of the array of surface-emitting laser diode mesas.

BRIEF DESCRIPTION OF THE FIGURES

The invention is more fully appreciated in connection with the following detailed description taken in conjunction with the accompanying drawings, in which.

Like reference numerals refer to corresponding parts throughout the several views of the drawings.

DETAILED DESCRIPTION OF THE INVENTION

Figure 2A:
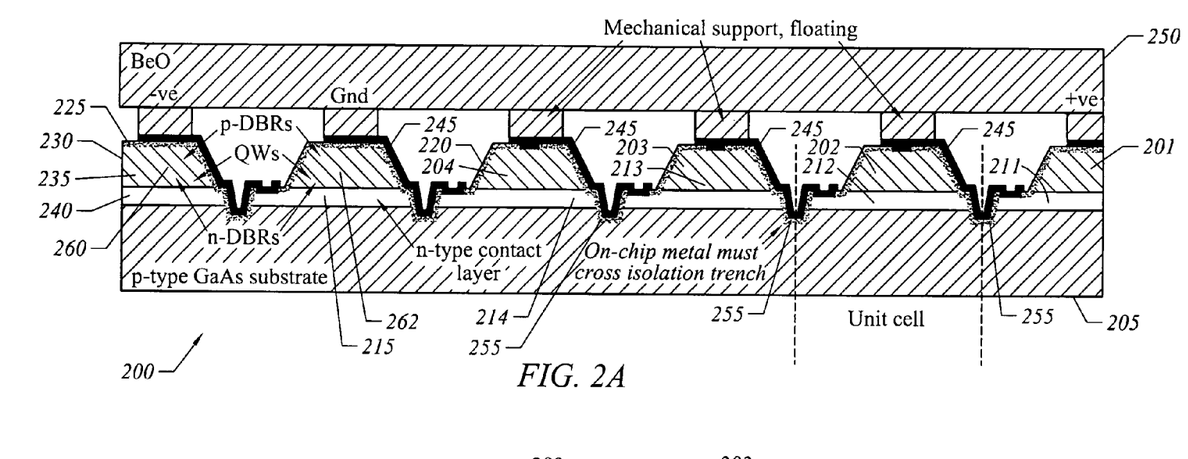
FIG. 2A illustrates an array of surface emitting laser connected in series in accordance with one embodiment of the present invention.

FIG. 2A illustrates an array of surface emitting laser diodes 201, 202, 203, and 204 formed on a p-type substrate 205 of a common die 200. Throughout the following discussion it will be understood that doping types are exemplary and that inverting the polarity of the doping types and corresponding operating voltages results in electrical devices having similar equivalent circuits and principles of operation.

Each laser diode 201, 202, 203, and 204 has a top p-type contact layer 220, p-type laser diode region 225 (e.g., a p-type distributed Bragg reflector (DBR), active region 230, n-type laser diode region 235 (e.g., a n-type DBR), and a bottom n-type contact layer 240. The bottom n-type contact layer 240 has a doping-thickness product selected to provide a low-resistance connection to an individual laser diode. In one implementation the bottom n-type contact layer 240 is approximately five to ten microns thick and is a moderate-to heavily-doped n-type layer that is grown epitaxially on top of the p-substrate. The doping and thickness of the n-type contact layer 240 is selected to provide nearly uniform current injection to the gain region of each laser diode.

Each laser diode 201, 202, 203, and 204 is patterned as a mesa etched down to the bottom n-type contact layer 240. In this embodiment, an electrical interconnect 245 is formed on the die that electrically couples the p-type contact layer 225 of one laser diode to the n-type contact layer 240 of a neighboring laser diode. The electrical interconnects 245 may be made via metal straps. For example, diode 201 is connected in series to diode 202 via an interconnect 245; diode 202 is connected in series to diode 203 via an interconnect 245; diode 204 is connected to diode 203 in series via an interconnect 245. A patterned submount 250, such a submount of BeO, is patterned to apply a voltage across the series-connected diodes 201, 202, 203, and 204 (i.e., a ground voltage and a voltage +ve). Submount 250 may include additional mechanical supports to other diodes such as diodes 202, 203, and 204.

Trenches 255 are formed in the n-type contact layer 240 between neighboring laser diodes to reduce parasitic conduction along the n-type contact layer. The trenches are lined with a passivation layer such as silicon dioxide, silicon nitride or any other suitable dielectric to prevent an electrical connection to the p-substrate. The trenches preferably have well-controlled sidewall slopes that form a relatively shallow angle with the die surface in order to facilitate reliably depositing continuous electrical interconnects across the trenches. However, it is difficult with current fabrication processes to fabricate isolation trenches that are smooth enough to be reliably passivated. This is due, in part, to any roughness or non-uniformities generated by an initial mesa etch through the top and bottom DBR regions, which may have a thickness on the order of about eight microns. Additionally, the five to ten microns of the n-contact layer must also be etched through to form the trenches. As a result trench isolation, by itself, may not provide sufficient, reliable isolation of the laser diodes in an laser array from parasitic conduction in the die. An additional parasitic current path around the edges of the trenches may thus develop unless additional isolation is also provided.

Additional electrical isolation of the laser diodes in the die is provided in the laser array by junction isolation. The polarity of the p-type substrate 205 is selected such that it has an opposite polarity to that of n-contact layer 240. As a result, a reverse-biased p-n junction is formed between p-type substrate and the bottom n-type contact layer such that p-type substrate 205 forms an isolation layer. In one embodiment the reverse bias is applied by virtue of a connection between an n-type contact layer and p-contact made to dummy mesas 260 and 262 formed from the same layers as the laser diodes.

The n-type contact layer 240 is, for electrical purposes, divided into n-type contact layer islands 211, 212, 213, 214, and 215 of n-type material. Under each n-type contact layer island 211, 212, 213, 214, and 215 is the p-type substrate 205 of opposite doping polarity. As a consequence p-n junctions are formed under each laser diode 201, 202, 203, and 204 and also under dummy mesa 262. By appropriately biasing the p-n junctions each laser diode 201, 202, 203, and 204 will be electrically isolated from parasitic conduction in the die via paths in the substrate 205 or the surfaces of the trenches.

Figure 2B:
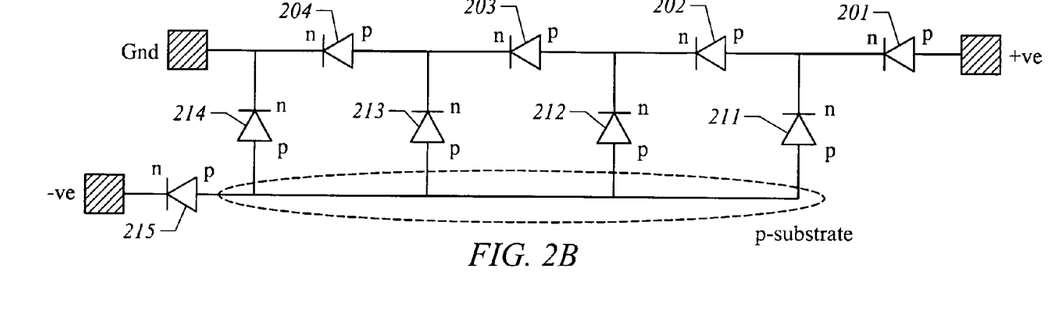
FIG. 2B illustrates an equivalent electrical circuit for the array of FIG. 2A.

FIG. 2B illustrates the equivalent circuit for the laser array of FIG. 2A. A voltage is applied to p-type substrate 205 by the p-n junction associated with n-type contact island 215, which is forward biased junction by virtue of the negative voltage, −ve applied to n-type contact layer island 215 applied to top contact layer 225 of dummy mesa 262. Reverse biased junctions are formed between the n-type contact layer islands 211, 212, 213, and 214 of each laser diode and the p-type substrate 205. This junction isolation prevents the parasitic flow of current through the substrate or along unpassivated edges of trenches between laser diodes. Diodes 201, 202, 203, and 204 represent the active laser diodes. Each is forward biased and the four diodes 201, 202, 203, and 204 are connected in series. So long as the p-substrate 205 is held at a potential more negative than the most negative laser diode electrode, all the isolation junctions 211-214 are reverse biased and provide the required electrical isolation between the laser diodes.

Figure 3:
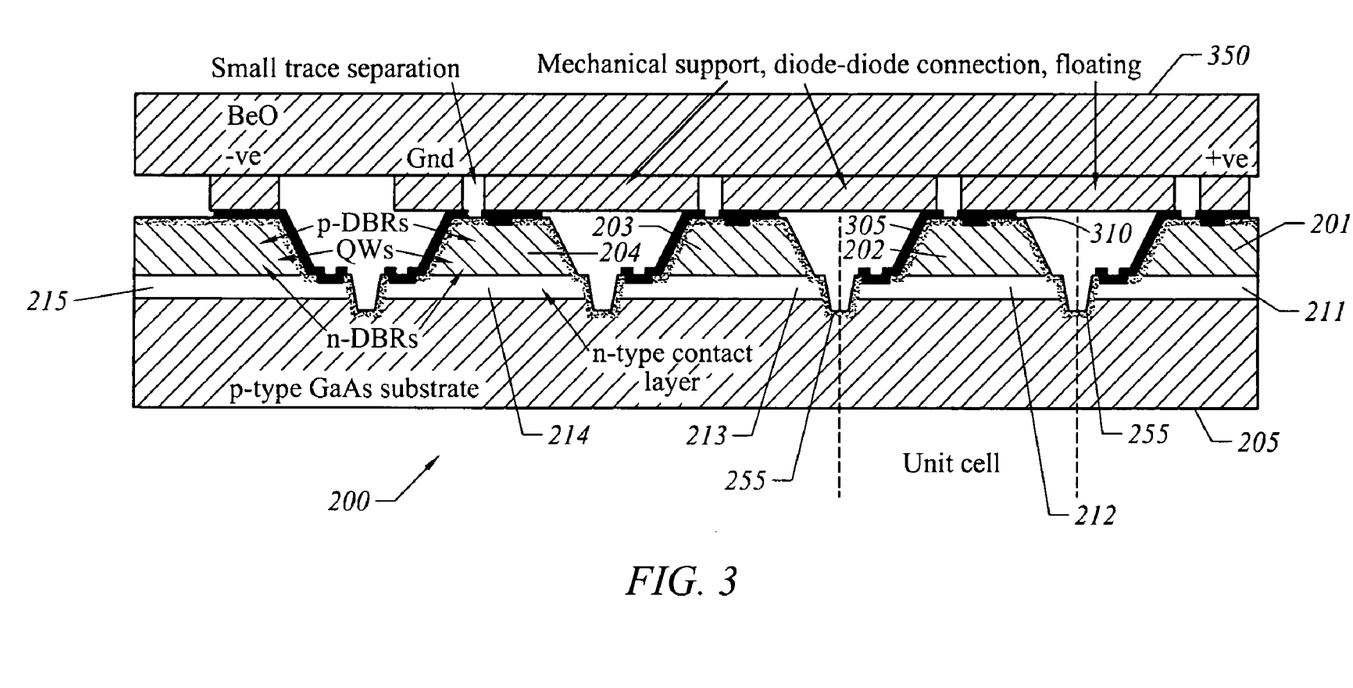
FIG. 3 illustrates an array of surface emitting laser connected in series in accordance with one embodiment of the present invention.

FIG. 3 shows an alternative approach to forming series electrical connections between laser diodes 201, 202, 203, and 204. The layer structures and equivalent electrical circuit are the same as those described above in regards to FIGS. 2A-2B. In this embodiment, no electrical lines need to cross the isolation trenches 255, significantly relaxing the constraints on how those trenches are formed. Instead, the connections are made by patterned metal on the sub-mount. The n-side contact 305 for each laser diode is brought to the top of the laser diode mesa in order to make contact to the sub-mount 350. The p-contact 310 for each mesa has a separate contact to the submount 350. In order to ensure that there are no shorts between the n- and p-contacts on either the die or sub-mount, and that the n-contact metal on the submount cannot touch the p-contact metal on the die and vice-versa, the contacts 310 and 305 must be kept far enough apart. This sets a minimum size for the mesa and limits packing density.

Figure 4:
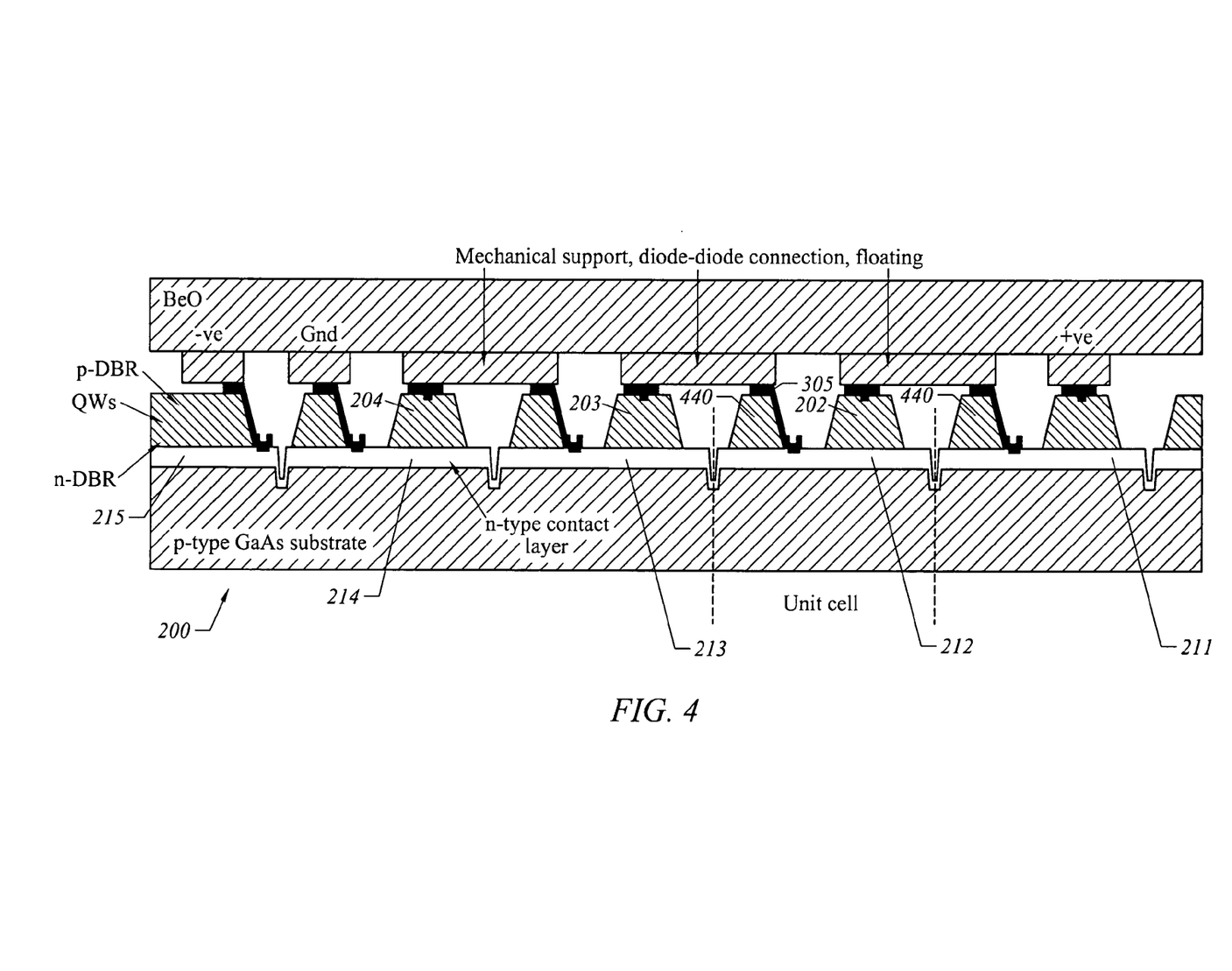
FIG. 4 illustrates an array of surface emitting laser connected in series in accordance with one embodiment of the present invention.

FIG. 4 shows another alternate approach to forming series electrical connections between laser diodes 201, 202, 203, and 204 that minimizes the risk of electrical shorts and increases packing density. The layer structures and equivalent electrical circuit are the same as those described above in regards to FIGS. 2A-2B. However, in this case additional support mesas 440 are formed on each n-type contact island 211, 212, 213, and 214. In this case, the n-contact metal is brought to the top of support mesas 440 proximate to the mesa of a corresponding laser diode 201, 202, 203, or 204. These support mesas 440 serve only to raise the n-contact metal to the same height as the p-contact metal and can be relatively small.

The surface emitting semiconductor laser arrays can be fabricated in a variety of different semiconductor materials systems. As one example, the laser may be formed in materials that can be epitaxially grown on a GaAs substrate. A variety of fabrication techniques may be used to fabricate the epitaxial layers of the laser array. In one embodiment the n-contact layer and laser diode layers are grown directly on a p-type substrate. However, in many surface emitting laser designs the light is transmitted through the substrate. Consequently, the doping level of the substrate must be relatively low (~1E17 $cm^{-3}$) to ensure low optical absorption and the defect density must be low to ensure high reliability of the surface emitting lasers. In general, such a combination of low doping and low defect density is difficult to obtain in either p-type or n-type GaAs wafers.

Figure 5:
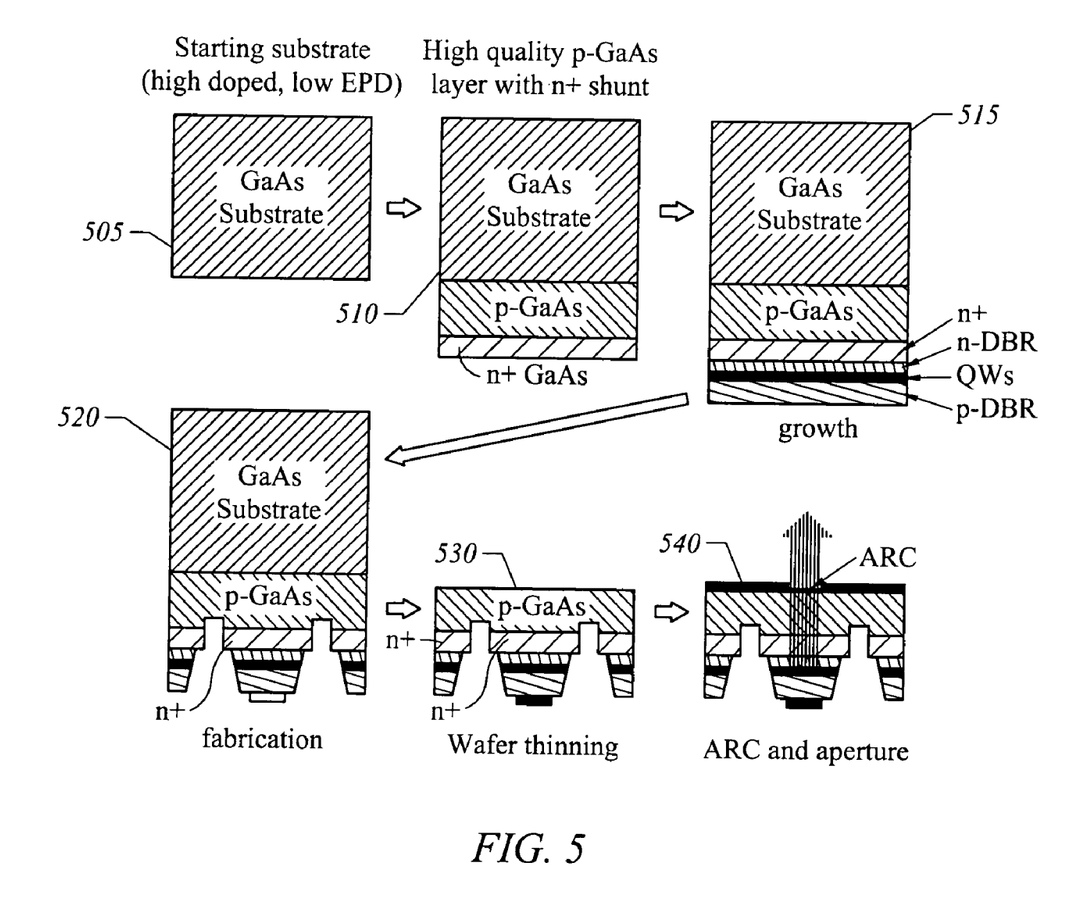
FIG. 5 illustrates a sequence of epitaxial growths and fabrication operations for forming series-connected arrays in accordance with one embodiment of the present invention.

In one embodiment a p-substrate is grown on top of another semiconductor substrate. FIG. 5 illustrates an approach to growing epitaxial layers having the required doping level and a low defect density. It is similar to a method described in U.S. Provisional Patent Application No. 60/434,671, the contents of which are hereby incorporated by reference. In this process, two epitaxial growth processes are used to form the laser layers. A substrate is selected 505 having a standard low defect density (low EPD). The substrate may be of any doping. Substrates with sufficiently low EPD are readily available from several suppliers if the doping density is high. A thick (~100 μm) layer of near-lattice-matched p-type material is then grown 510 on the starting substrate in a first epitaxial growth process. The grown layer matches the defect density of the starting substrate but can have its composition and doping level adjusted over a wide range while still maintaining a good lattice match to the substrate. An additional n-type conduction layer (~5 μm thick) is grown. In one embodiment a refinishing step is performed to prepare the substrate for a second step of epitaxy. The laser diode structure is then grown 515 in a second step of epitaxy. After growth of the epitaxial structure front-side processing is performed 520. The n-GaAs substrate is then completely removed 530 and a suitable anti-reflection coating (ARC) is deposited 540 to couple light through the p-GaAs layer.

Figure 6:
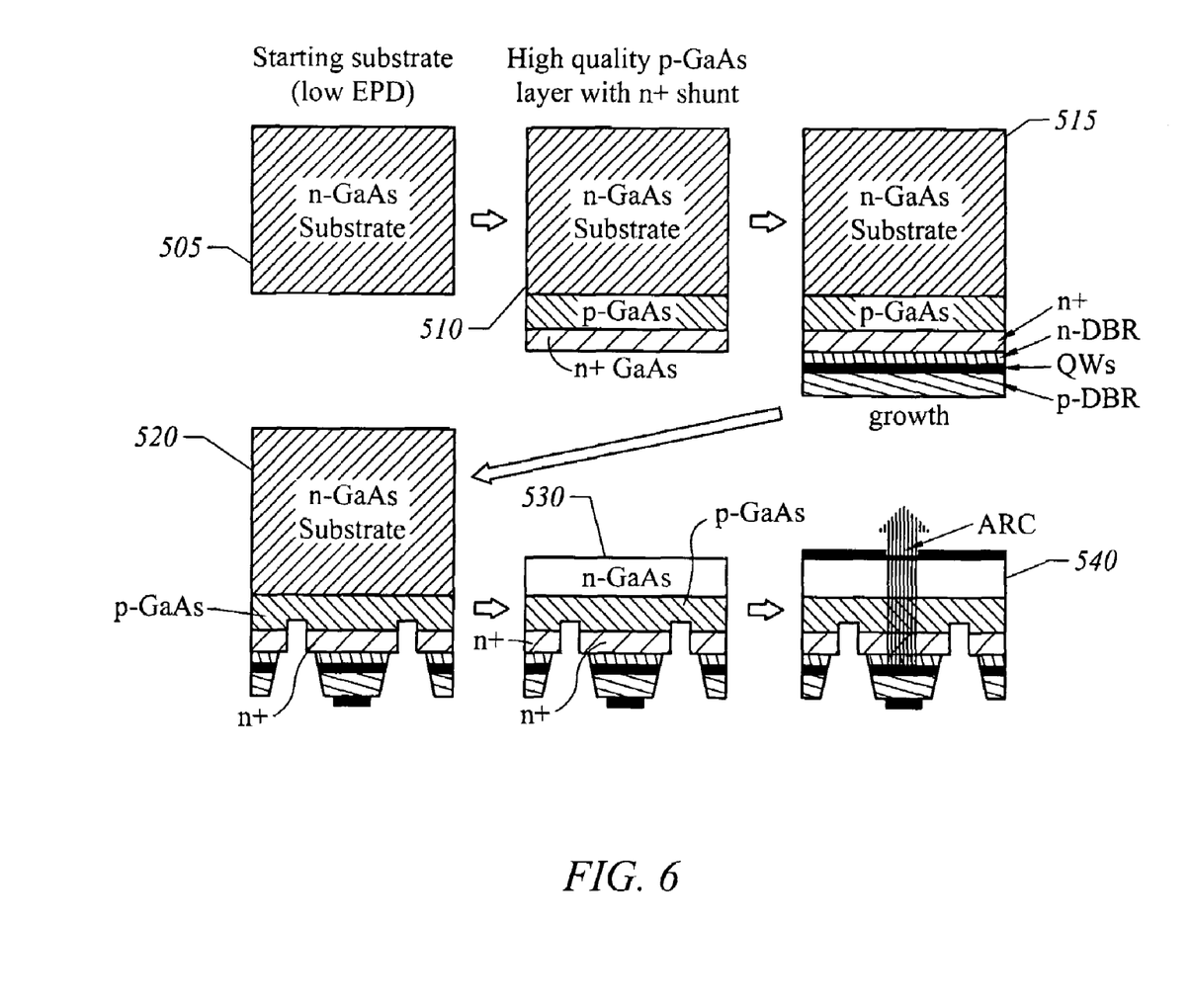
FIG. 6 illustrates a sequence of epitaxial growths and fabrication operations for forming series-connected arrays in accordance with one embodiment of the present invention.

FIG. 6 shows a variation on the epitaxial layer structure shown in FIG. 5 except that in step 630 the n-GaAs is only partially removed. In this case, part of the starting substrate remains in the beam path, and low doping is necessary to minimize optical losses. This makes it difficult to achieve low defect density, but with sufficient thickness of the p-type isolation layer and n-type conduction layer, as well as appropriate choice of growth conditions, an adequate barrier can be established between the substrate and critical device layers. Note that the p-GaAs layer is thinner than the p-type layer grown in FIG. 5 but achieves a similar result. One advantage is that the total thickness of grown material is reduced, making the structure less costly, and the need for the extra wafer refinishing step is eliminated.

The laser arrays can be fabricated using a variety of laser fabrication processes. The lasers arrays may, for example, be fabricated as vertical cavity surface emitting lasers in which Bragg reflectors provide all of the optical feedback for lasing. Alternatively, the laser arrays may be fabricated as extended cavity surface emitting lasers in which an additional external reflector provides optical feedback in addition to that of the Bragg reflectors, thereby providing additional control of wavelength and mode stability.

In an exemplary fabrication process, the laser arrays are for use in extended cavity surface emitting lasers. The etched mesa structures are preferably flip chip bonded to enhance heat extraction and increase maximum power and efficiency. Referring back to FIGS. 2-4, each unit cell contains one laser diode and several unit cells comprise an array. In an exemplary fabrication process for an extended cavity surface emitting laser the current aperture for each laser is defined in each unit cell by patterned, masked high-energy proton ion implantation. The protons cause crystalline defects in the implanted regions that greatly increase their resistivity. This, in turn, allows current to flow only through the unimplanted aperture of the laser. The aperture is at the center of the mesa and it is in this aperture that lasing occurs. A trench layer is etched around each unit cell in the array by masked reactive ion etching (RIE) in a chlorine-based plasma. The trench extends all of the way into the p-type substrate. This trench electrically isolates the laser diodes from each other and allows them to be run in series rather than in parallel.

The mesa structure for each laser diode may be defined in each unit cell by masked reactive ion etching (RIE) in a chlorine-based plasma. It is etched into, but not through, the n-type epitaxial contact layer 240. The purpose of the mesa etch is to allow n-type ohmic contacts to be deposited on the n-type contact layers. The entire wafer is passivated with a layer of PE-CVD silicon nitride ($Si_3N_4$). After nitride deposition, openings for n- and p-contacts are created in the nitride by patterned, masked reactive ion etching with a fluorine-based plasma. The p-contacts are defined on top of the mesas by blanket sputtering of p-metal followed by patterned, masked etching of the p-metal in regions where it is not needed. The n-contacts are defined at the bottoms of the mesas by patterned, masked evaporation of metal. After their deposition, they are alloyed to the n-type contact layer. After the p- and n-contacts are formed, the laser diodes and test patterns may be tested by electrical and optical probing on an automatic stepping probe station.

The backside of the wafer is lapped and polished until the wafer is very thin. The purpose is to make it possible to scribe and break the arrays and to reduce optical absorption in the p-type substrate layer. The polish must be of optical quality because it is through this surface that the laser light is emitted. The polished backside of the wafer is anti-reflection coated (ARC) with one or more dielectric materials. The thickness, index, and uniformity of this coating must be precisely maintained so that reflectance of this surface is minimized at the laser's operating wavelength. Backside aperture metal is deposited by patterned, masked evaporation of metal. These apertures are concentric with the implanted active region of the laser diodes. The wafer is scribed and broken into individual arrays. The arrays are then bonded to a patterned, metalized submount.

Figure 7A:
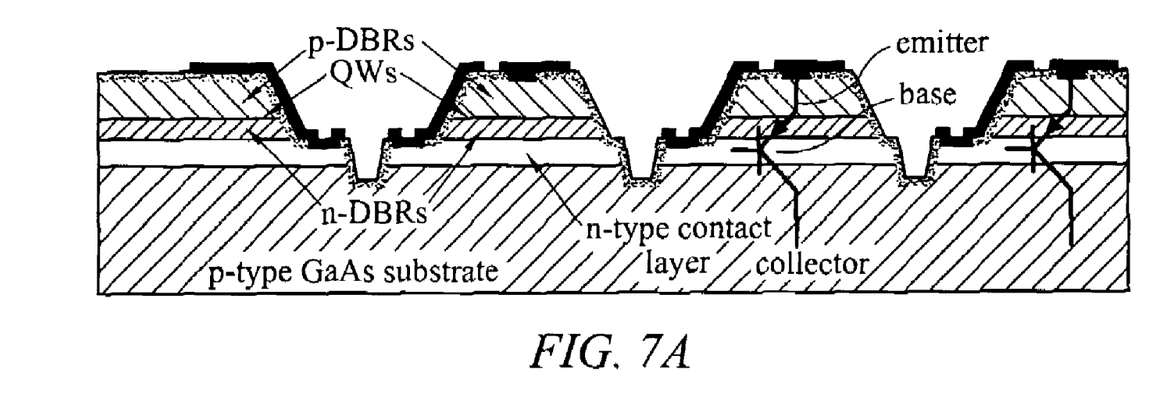
FIG. 7A illustrates parasitic bipolar transistors in a laser array.
Figure 7B:
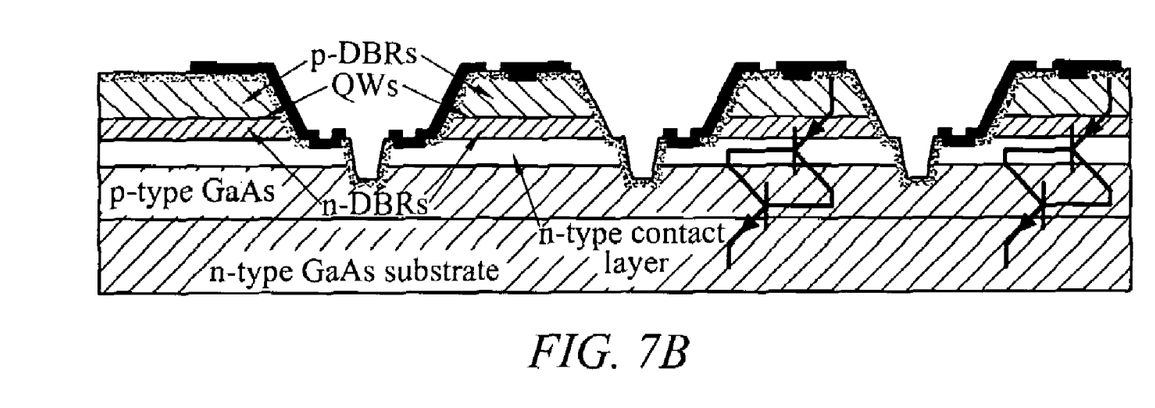
FIG. 7B illustrates parasitic thyristors in a laser array.

The laser array is preferably designed and fabricated to minimize the effects of parasitic bipolar devices. FIGS. 7A and 7B illustrates the parasitic bipolar devices that are formed in the laser array. FIG. 7A illustrates an arrangement in which every device mesa will include a vertical parasitic PNP transistor (two only are shown for illustration in FIG. 7A). FIG. 7B illustrates an arrangement in which an additional junction introduces an extra parasitic NPN transistor coupled to the parasitic PNP in such a manner as to form a parasitic thyristor. The parasitic bipolar transistors may lead to undesired current paths, shunting current to the substrate that would otherwise flow through the laser diodes. Additionally, in the embodiment of FIG. 7B there is a possibility of latch-up of the parasitic thyrister leading to device failure at least until the power is cycled. The effects of the parasitic bipolar devices can be reduced by choosing design parameters such that the gain of each parasitic bipolar transistors is low. For example the equivalent base widths of the parasitic bipolar transistor may be selected to be comparatively wide, and in the case of the PNP device the base includes the n-DBR. The gains of these devices will therefore be very low and the parasitic bipolar transistors are unlikely to present a significant problem.

Figure 8A:
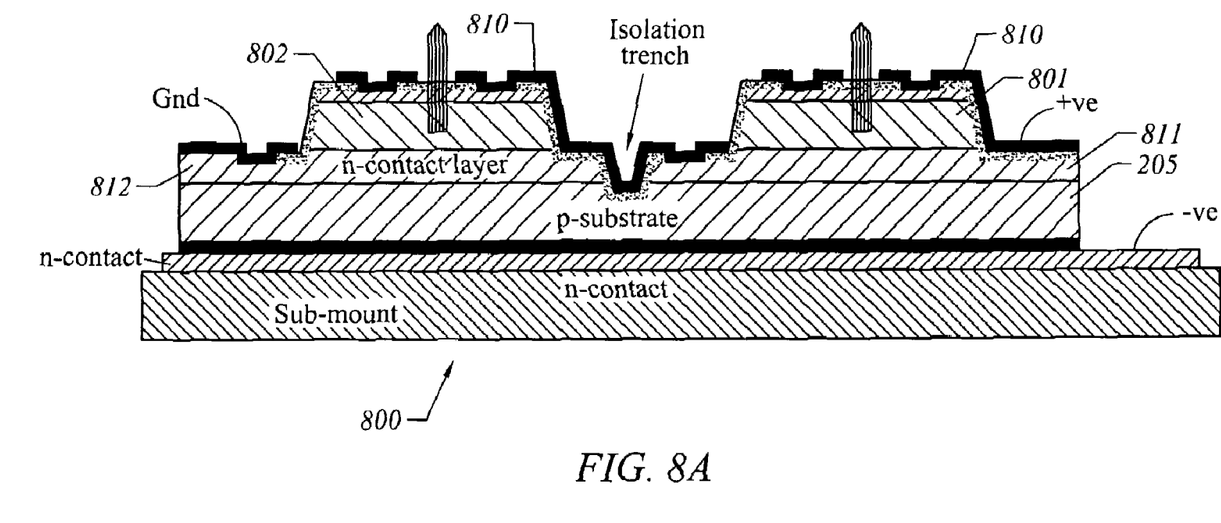
FIG. 8A illustrates an alternate embodiment of a series-connection array for topside emission of light.
Figure 8B:
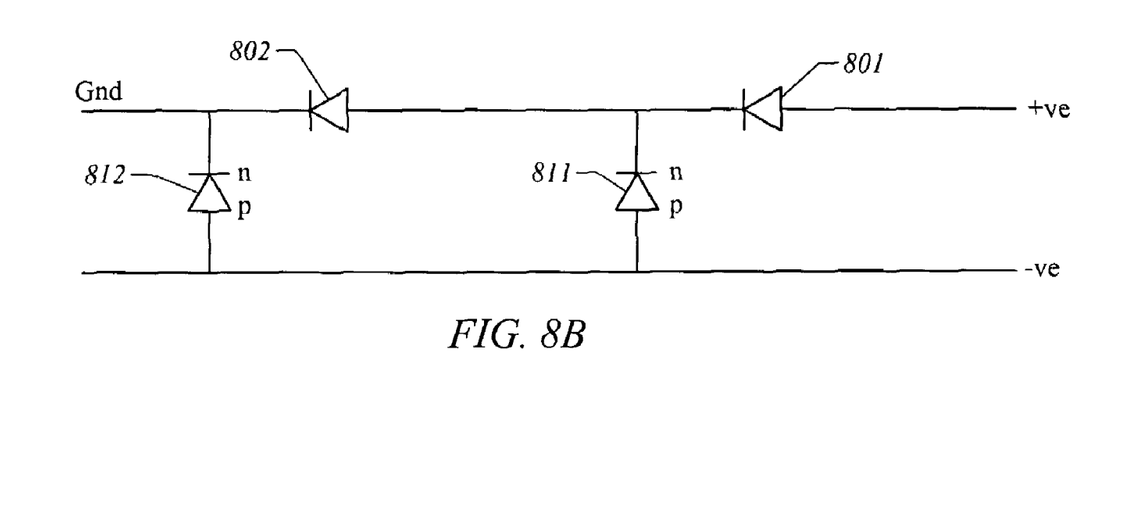
FIG. 8B illustrates an equivalent electric circuit for the array of FIG. 8A.

As previously described, in many applications surface emitting lasers emit light through the substrate. However, embodiments of the present invention also include surface emitting lasers in which light is emitted from the top of the mesas. FIG. 8A illustrates a top-emitting surface emitting laser array 800 built using similar junction isolation structures. Since the light is emitted from the top of the epitaxially grown layers a sub-mount cannot be used to complete the diode-to-diode series connections. Consequently on-wafer metal interconnects 810 are utilized to form the diode-to-diode series connections with wirebonds to the die surface providing the external connections. The submount may be used to form an electrical connection to the p-substrate 205. FIG. 8B illustrates the corresponding equivalent circuit diagram for array 800 for laser diodes 801 and 802 and p-n junctions 811 and 812 formed between n-contact islands and the p-type substrate 205.

The techniques described above can be used to construct arrays in which sub-arrays are operated in series or in parallel. This opens several possibilities for scaling the number of laser emitters. For a single array of series-wired devices, as the number of devices grows, the reverse voltage on the isolation junctions increases in proportion. The number of laser diodes that can be connected in series is thus limited because after a certain number of laser diodes have been connected in series the isolation voltage will exceed the reverse-breakdown voltage of the isolation junction, and isolation will be compromised. The maximum number of laser diodes that can be connected in series will depend upon the formation of the junction isolation layer and the forward voltage of each laser diode. By configuring the device as an array of sub-arrays, the total voltage can be constrained to the voltage of the sub-array. If the sub-arrays are series-wired, then voltages of the sub-arrays will be more uniform than the voltages of the single devices, as the voltage differences between the elements of a sub-array will tend to average out. In this manner one of the primary benefits of a series-wired array can be preserved.

If voltage uniformity is not an issue, then configuring the array as series-wired sub-arrays of parallel-wired devices will have the benefit of increasing the required supply voltage, relative to the supply current, which allows for more efficient power supplies to be used. Such an array is also potentially very simple to construct, as the element to element wiring can be done on the wafer, while the sub-array to sub-array wiring can be done on the submount.

While FIGS. 2-4 also show contact to the p-substrate via a forward biased junction in an alternate embodiment the p-substrate can also be contacted directly using an appropriate metalized ring contact on the die bottom (emitting) surface. External contact to the metal can be made by conventional wirebond techniques.

The foregoing description, for purposes of explanation, used specific nomenclature to provide a thorough understanding of the invention. However, it will be apparent to one skilled in the art that specific details are not required in order to practice the invention. Thus, the foregoing descriptions of specific embodiments of the invention are presented for purposes of illustration and description. They are not intended to be exhaustive or to limit the invention to the precise forms disclosed; obviously, many modifications and variations are possible in view of the above teachings. The embodiments were chosen and described in order to best explain the principles of the invention and its practical applications, they thereby enable others skilled in the art to best utilize the invention and various embodiments with various modifications as are suited to the particular use contemplated. It is intended that the following claims and their equivalents define the scope of the invention.

What is claimed is:

1. A laser apparatus, comprising:
    an array of surface-emitting semiconductor laser diodes formed on a common die and electrically connected in series via series connections;

at least one p-n junction in said die disposed under said array, said at least one p-n junction configured to electrically isolate each of said surface-emitting semiconductor laser diodes from parasitic conduction in said die during operation of said array;

each said surface-emitting semiconductor laser diode comprises a mesa having a top contact layer and a bottom contact layer formed on a substrate layer, said bottom contact layer having a doping polarity opposite that of said substrate layer to form said at least one p-n junction; and trenches formed in said bottom contact layer between said surface-emitting semiconductor laser diodes to provide trench isolation;

wherein at least a portion of the series connections between laser diodes is provided by a submount.

2. The laser apparatus of claim 1, wherein said surface-emitting semiconductor laser diodes comprise at least one of vertical cavity surface emitting lasers and extended cavity surface emitting lasers.

3. The laser apparatus of claim 1, wherein said trenches define islands of said bottom contact layer under each mesa such that each mesa has an isolating p-n junction formed between said bottom contact layer and said substrate layer.

4. The laser apparatus of claim 3, wherein a forward biased p-n junction is formed on a portion of said die for biasing said substrate layer.

5. The laser apparatus of claim 1, wherein metal interconnects are formed on said die for connecting laser diodes in series.

6. The laser apparatus of claim 5, wherein the interconnects on the die are isolated by the trenches and the submount is patterned to complete the series connections between laser diodes.

7. The laser apparatus of claim 6, wherein the submount has separate n-contacts and p-contacts for completing the series connections between laser diodes.

8. The laser apparatus of claim 1, further comprising a second array disposed on said common die and electrically connected in series also having at least one p-n junction in said die configured to electrically isolate each of said laser diodes in said second array from parasitic conduction in said die during operation of said second array.

9. The laser apparatus of claim 1, wherein the submount includes contacts to apply a series voltage across the array of laser diodes.

10. The laser apparatus of claim 9, wherein the submount includes a contact to apply a reverse bias for junction isolation.

11. A laser system, comprising an array of surface-emitting semiconductor laser diodes having mesas formed on an electrical contact layer of a common die, said array of surface-emitting semiconductor laser diodes electrically connected in series via series connections between top contacts of each mesa and bottom contacts to said electrical connection layer;

trenches formed in said electrical contact layer in regions between said mesas for blocking parasitic electrical conduction through said contact layer; and a substrate layer in said die disposed under said electrical contact layer and having a polarity opposite to that of said electrical contact layer for providing p-n diode junction isolation of parasitic conduction paths in said die during operation of said array of surface-emitting laser diodes;

wherein at least a portion of the series connections between laser diodes is provided by a submount.

12. The laser system of claim 11, wherein said surface-emitting semiconductor laser diodes comprise at least one of vertical cavity surface emitting lasers and extended cavity surface emitting lasers.

13. The laser system of claim 11, wherein each trench defines islands of said contact layer whereby each mesa has a corresponding p-n diode junction defined by one island of said contact layer and said substrate for providing p-n diode junction isolation.

14. The laser system of claim 11, wherein a forward biased p-n junction is formed on a portion of said die for biasing said substrate.

15. The laser apparatus of claim 11, wherein metal interconnects are formed on said die for connecting laser diodes in series.

16. The laser system of claim 15, wherein the interconnects on the die are isolated by the trenches and the submount is patterned to complete the series connections between laser diodes.

17. The laser system of claim 16, wherein the submount has separate n-contacts and p-contacts for completing the series connections between laser diodes.

18. The laser system of claim 11, wherein the submount includes contacts to apply a series voltage across the array of laser diodes.

19. The laser system of claim 18, wherein the submount includes a contact to apply a reverse bias for junction isolation.

20. A laser system, comprising:

an array of surface-emitting semiconductor laser diodes formed on a common die, each laser diode having a top contact layer for forming a first electrical connection, a bottom laser diode region of a second doping polarity, and a second contact layer of said second doping polarity, each laser diode having a top electrical contact electrically coupled to said first contact layer and each laser diode patterned as a mesa having a bottom electrical contact to a portion of said second contact layer;

electrical interconnections coupling a plurality of surface emitting laser diodes in said array in series via series connections;

isolation trenches extending through said second contact layer in regions between said plurality of surface emitting laser diodes;

a substrate layer of said first doping type disposed in said die for providing junction isolation of series connected laser diodes; and an electrical connection configured to reverse-bias said substrate layer with respect to said contact layer during operation of said array of surface-emitting semiconductor laser diodes;

wherein at least a portion of the series connections between laser diodes is provided by a submount.

21. The laser system of claim 20, wherein the interconnections on the die are isolated by the trenches and the submount is patterned to complete the series connections between laser diodes.

22. The laser system of claim 21, wherein the submount has separate n-contacts and p-contacts for completing the series connections between laser diodes.

23. The laser system of claim 20, wherein the submount includes contacts to apply a series voltage across the array of laser diodes.

24. The laser system of claim 23, wherein the submount includes a contact to apply a reverse bias for junction isolation.

25. A laser system, comprising
a first array of surface-emitting semiconductor laser diodes formed on an electrical contact layer of a common die and electrically connected in series via first series connections;
a second array of surface-emitting semiconductor laser diodes formed on the electrical contact layer of the common die and electrically connected in series via second series connections;
isolation trenches formed in said electrical contact layer in regions between said first and second arrays of laser diodes for blocking parasitic electrical conduction through said contact layer; and
at least one p-n junction disposed under said first array and said second array for providing p-n diode junction isolation of substrate conduction paths during operation of said first array of surface-emitting laser diodes and said second array of surface-emitting laser diodes;
wherein the number of laser diodes in said first array and the number of laser diodes in said second array that are connected in series are each selected to be no greater than a maximum number for which junction isolation may be obtained while operating said first array and said second array;
wherein at least a portion of the first series connections and the second series connections is provided by a submount.

* * * * *